(12) United States Patent
Dean et al.

(10) Patent No.: US 9,787,057 B2
(45) Date of Patent: Oct. 10, 2017

(54) LASER DIODE DRIVER DAMPING CIRCUIT

(71) Applicant: Texas Instruments Incorporated, Dallas, TX (US)

(72) Inventors: Douglas Warren Dean, Eagan, MN (US); Craig Matthew Brannon, Maplewood, MN (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 95 days.

(21) Appl. No.: 14/861,299

(22) Filed: Sep. 22, 2015

(65) Prior Publication Data

US 2016/0013617 A1   Jan. 14, 2016

Related U.S. Application Data

(63) Continuation of application No. 13/245,268, filed on Sep. 26, 2011, now Pat. No. 9,183,873.

(51) Int. Cl.
| | |
|---|---|
| *G11B 7/126* | (2012.01) |
| *H01S 5/042* | (2006.01) |
| *H01S 5/068* | (2006.01) |
| *H03K 17/60* | (2006.01) |
| *H03K 5/08* | (2006.01) |
| *H03K 5/12* | (2006.01) |

(52) U.S. Cl.
CPC .......... *H01S 5/06817* (2013.01); *G11B 7/126* (2013.01); *H01S 5/042* (2013.01); *H01S 5/06825* (2013.01); *H03K 5/086* (2013.01); *H03K 5/12* (2013.01); *H03K 17/60* (2013.01)

(58) Field of Classification Search
CPC ..... H03K 17/60–17/68; H01S 5/06825; H01S 5/06817; G11B 7/125–7/127
See application file for complete search history.

(56) References Cited

U.S. PATENT DOCUMENTS

| | | | |
|---|---|---|---|
| 4,797,633 A | 1/1989 | Humphrey | |
| 5,396,480 A * | 3/1995 | Morishita | G11B 7/00454 369/100 |
| 5,416,584 A | 5/1995 | Kay | |
| 5,533,053 A | 7/1996 | Hershbarger | |
| 5,955,908 A * | 9/1999 | Tam | H03K 5/08 327/108 |
| 6,229,383 B1 | 5/2001 | Ooishi | |
| 6,504,419 B1 * | 1/2003 | Damitio | H03K 17/6257 327/112 |
| 8,300,510 B1 | 10/2012 | Dean et al. | |
| 2005/0195869 A1 | 9/2005 | Kubota | |
| 2010/0315918 A1 | 12/2010 | Dean et al. | |

* cited by examiner

*Primary Examiner* — Xinning Niu
*Assistant Examiner* — Sean Hagan
(74) *Attorney, Agent, or Firm* — Tuenlap D. Chan; Charles A. Brill; Frank D. Cimino

(57) ABSTRACT

A damping circuit having an input terminal and an output terminal is described. The damping circuit comprises a driver having an input and an output; an RC circuit coupled between the input terminal and the output; and a resistor coupled between the output and the output terminal, wherein the RC circuit delays passing a signal from the output terminal to the input terminal and a low impedance associated with the driver generally reduces ringing.

24 Claims, 5 Drawing Sheets

LASER DIODE DRIVER DAMPING CIRCUIT

CROSS-REFERENCE TO RELATED APPLICATION

Under 35 U.S.C. §120, this continuation application claims priority to and benefits of U.S. patent application Ser. No. 13/245,268, filed on Sep. 26, 2011, the entirety of which is incorporated herein by reference.

BACKGROUND

With the evolution of electronic devices, there is a continual demand for enhanced speed, capacity and efficiency in various areas including electronic data storage. Motivators for this evolution may be the increasing interest in video (e.g., movies, family videos), audio (e.g., songs, books), and images (e.g., pictures). Optical disk drives have emerged as one viable solution for supplying removable high capacity storage. When these drives include light sources, signals sent to these sources should be properly processed so these sources emit the appropriate light for reading and writing data optically.

BRIEF DESCRIPTION OF THE DRAWINGS

The laser diode driver damping circuit may be better understood with reference to the following figures. The components within the figures are not necessarily to scale, emphasis instead being placed upon clearly illustrating the principles of the disclosure. Moreover, in the figures, like reference numerals designate corresponding parts or blocks throughout the different views.

Figure 1A:
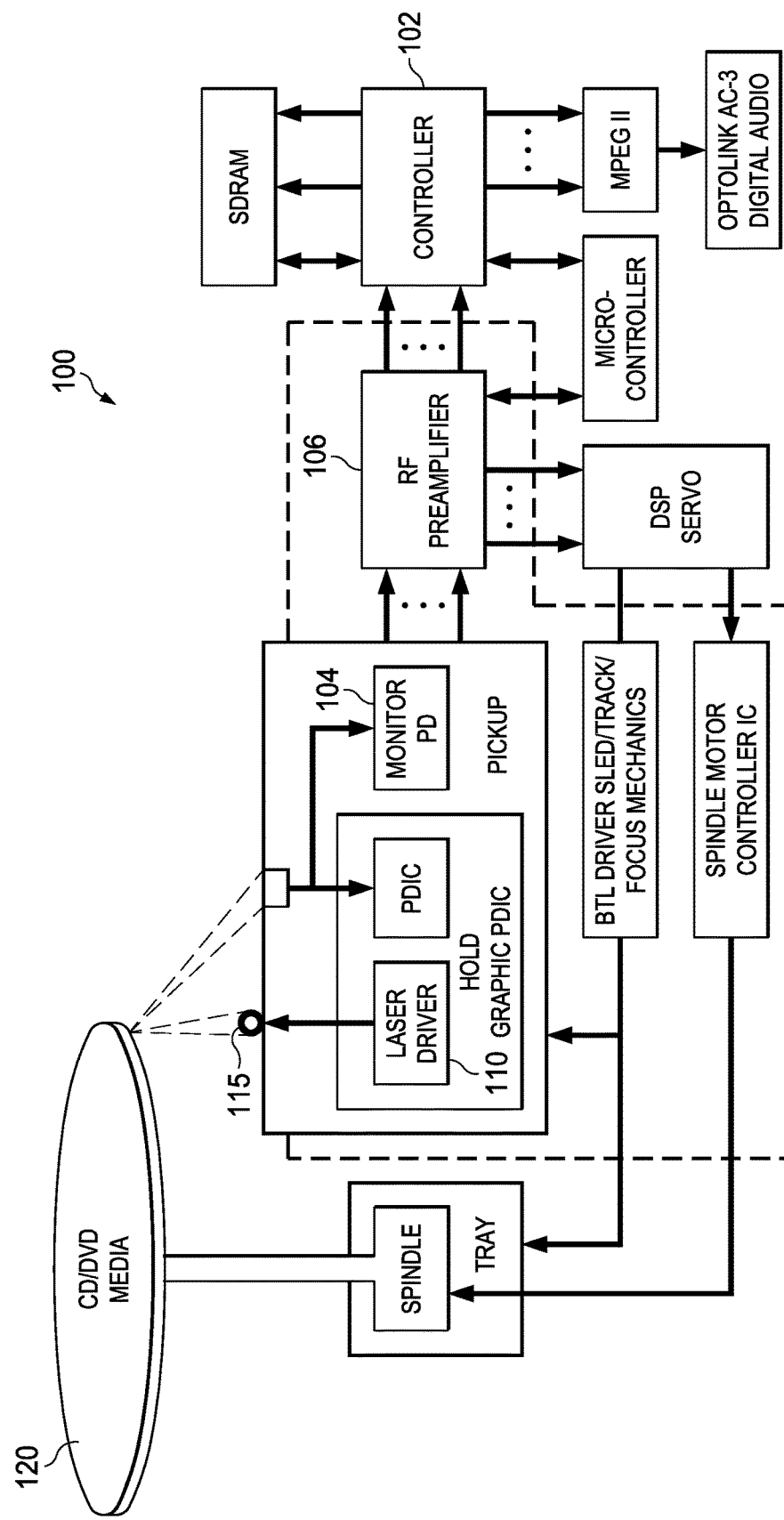
FIG. 1A, is a system drawing illustrating components within an optical disk drive.

While the laser diode driver damping circuit is susceptible to various modifications and alternative forms, specific embodiments have been shown by way of example in the drawings and subsequently are described in detail. It should be understood, however, that the description herein of specific embodiments is not intended to limit the laser diode driver damping circuit to the particular forms disclosed. In contrast, the intention is to cover all modifications, equivalents, and alternatives falling within the spirit and scope of the laser diode driver damping circuit as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

Turning now to FIG. 1A, a system drawing illustrating components within is an optical disk drive 100. A controller 102 monitors the output light power level of a laser diode 115 using a Monitor PD 104, or monitor photodiode, and an RF, or radio frequency, preamplifier 106. This controller can keep an expected power level by changing an input control current of a laser driver 110 through an APC, or auto power controlling, feedback loop, even if a light source 115 such as a laser diode changes output power due to various conditions, such as temperature changes, etc.

Also, the controller 102 sets the enable signal for switching some current channels of the laser driver 110, which arranges a data writing pulse. In the case of data reading, the controller 102 may only set a direct current (DC) by disabling the switching channels and applying the designated current. In the case of data writing, the controller 102 applies some adjustment signals, or enable-switching signals, to arrange the writing pulse waveform as a combination of switching current pulses. The power level can be changed as each switching channel has its own designated current. The controller 102 can arrange these designated currents based on the Monitor PD 104 output with some detecting function in the RF preamplifier 106. At the very least, this controller has two power control levels, one for the read power and one for the write power.

As illustrated in this figure, the laser driver 110 sends a signal that prompts an associated light source 115 (e.g., laser diode) to emit light. The light source 115 may emit light at any of a number of wavelengths (e.g., 400 nm, 650 nm, 780 nm). Light from this source contacts an associated optical media 120, such as a compact disc (CD), blue ray device (Blu-ray), or digital versatile disk (DVD). Light contacting the optical media can either facilitate data storage or data retrieval from the optical media 120.

Figure 1B:
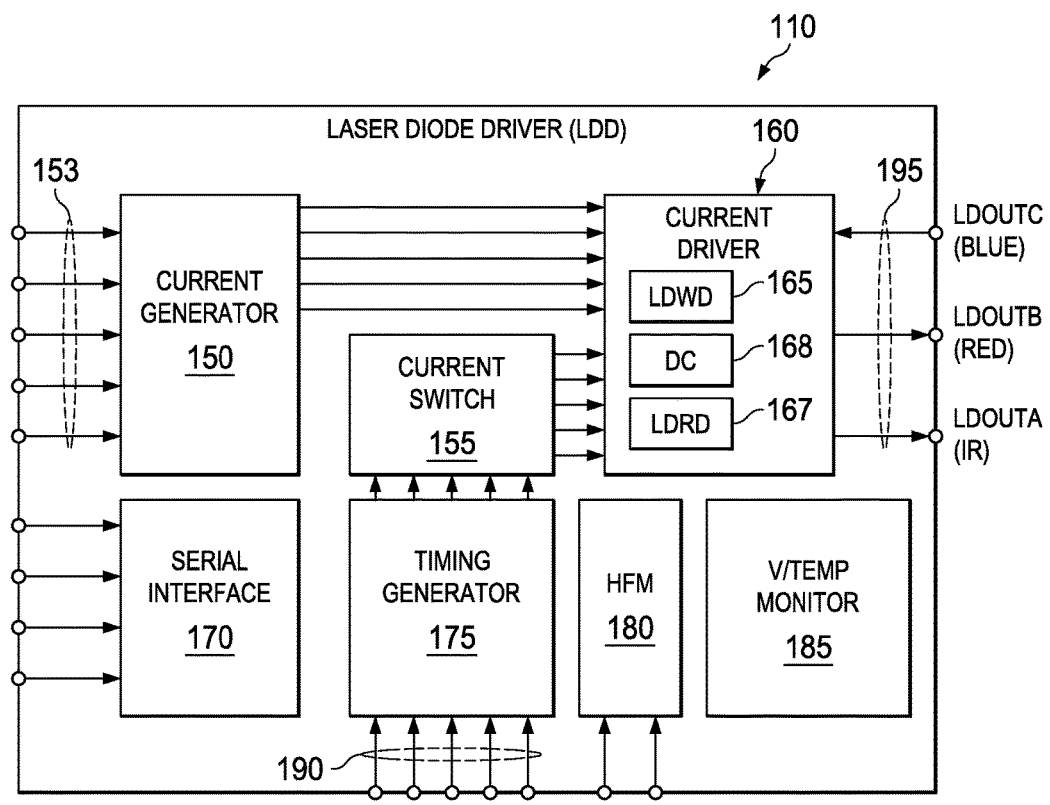
FIG. 1B is a block diagram illustrating an enlarged view of the laser diode driver of FIG. 1A.

FIG. 1B is an enlarged view of the innovative laser driver 110, which may be a laser diode driver (LDD). The LDD 110 is an integrated, fully programmable, multi-function product that controls and drives laser diodes (e.g., light source 115) within optical drives as described with reference to FIG. 1A. More specifically, the LDD 110 can apply the current for reading, writing, and erasing removable high capacity disks (e.g., capacities greater than approximately 50 Gbytes/disk). The LDD 110 also has low noise (e.g., noise of approximately 0.5 nA/rt-Hz), high speed (e.g., 800 Mb/s) and high current (e.g., approximately 1 amp). Any numbers included in this application are for illustrative purposes only and numerous alternative implementations may result from selecting different quantitative values.

At a high level, the LDD 110 may include a current generator 150. Generally, the current generator 150 receives some input signals 153 associated with several input channels, which have an associated input current. The current generator 150 works in tandem with current driver nd scales the input currents by some gain factors. The current at the output 195 is typically a summation of these scaled input currents from the individual channels. Thus, the current generator 150 and current driver 160 control the amount of current for each output 195. Besides receiving current signals from the current generator 150, the current driver 160 also receives signals from the current switch 155. The current switch 155 and the timing generator 175, via the serial interface, control which of the channels should be turned on or turned off. The timing generator 175 receives various channel enable inputs 190. Though there are five channel enable inputs that are shown in FIG. 1B, the LDD 110 may have any number of channel enable inputs, such as two, six, or the like. The timing generator 175 determines from the channel enable inputs 190 and serial interface control, whether a given input channel will be either turned on or turned off and transmits corresponding signals to the current switch. The current switch 155 processes these signals and then transmits signals to the current driver 160 designating which channels are active. The current driver 160 is the last current gain stage and drives the laser diodes directly. In other words, the output signals from the current driver 160 also serve as output signals for the LDD 110, which are used in driving the laser diode, or the light source 115 (see FIG. 1A).

In addition to the above-mentioned devices, the LDD 110 includes additional components. A serial interface (I/F) 170 has several inputs (e.g., serial data enable, serial data, serial clock) that may be used for programming the gain, enabling channels, and turning on the LDD. The LDD 110 also includes a high frequency modulator (HFM) 180 and voltage/temperature monitor (V/Temp Monitor) 185. The HFM 180 modulates the output current for reducing mode-hopping noise of the laser diodes. The voltage/temperature monitor 185 monitors the laser diode voltage drop and on-chip temperature. One skilled in the art will appreciate that numerous alternative implementations may result from removing any or several of the blocks within the LDD 110.

Though not illustrated, an integrated circuit for the LDD 110 generally has four switching, or write channels, and one static, or read channel for each output. Each driver can be programmed independently from several milliamps to hundreds of milliamps. The current driver 160 includes a Laser Diode Write Driver (LDWD) 165 for each output that allows each switching channel to be programmed independently and has very fast switching times, low power, and good accuracy. The current driver 160 also includes a Laser Diode Read Driver (LDRD) 167 which produces a static current. The final output current is a summation of each individual switching channel from the LDWD and the static channel from the LDRD. The combination of the output currents from these channels are used to write data to the media.

The current driver 160 may also include a damping, or matching block 168, which may include one or more damping circuits. For example, there may be three damping circuits associated with each of the output nodes. With this circuitry, ringing associated with driving the laser diode, interconnect, and its inductive package, can be reduced. Reducing ringing can improve the effectiveness in writing data to the optical media 120 (see FIG. 1A) in the case of the LDWD 165. The damping circuit 168 may be utilized with any kind of write driver circuit such as the LDWD 165, and may also share a terminal with the LDRD 167.

Figure 2A:
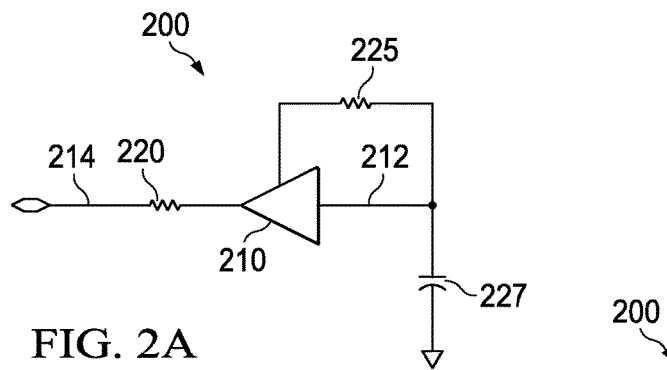
FIG. 2A is a first simplified circuit diagram of the laser diode driver damping circuit of FIG. 1B.
Figure 2B:
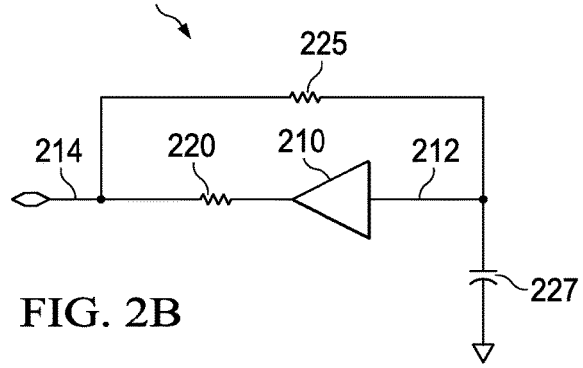
FIG. 2B is a second simplified circuit diagram of the laser diode driver damping circuit of FIG. 1B.

FIG. 2A and FIG. 2B are simplified circuit diagram of a driver, such as the laser diode driver damping circuit 168. Alternatively, this driver may be a transmission line driver, a line driver, an output driver, or the like. The circuit diagram 200 may include a driver 210 with a driver input 212 and an driver output 214. This output may connect to the output of the LDWD 165 and the output of the LDRD 167. In short, this damping circuit reduces ringing by using an R-C circuit that essentially stores a value that later slowly transitions to a new value. The driver 210 connects to the output 214 through a resistor 220. In addition, the driver input 212 connects to both a resistor 225 and a capacitor 227. More specifically, the resistor 225 connects between two different inputs to the driver 210. While, the capacitor 227 connects between the driver input 212 and low voltage supply, like ground. With these components, the circuit diagram 200 creates a time constant which delays passing a signal from the output 214 to the input 212. In other words, the input 212 will generally stay at its steady-state operating point. As the output 214 changes, the input 212 will eventually change. This output is held to a level approximately the same as the input 212, due to the low impedance associated with the driver 210. This low impedance will help reduce the ringing of the current that is being switched through the laser diode driver 110. Eventually, the output 214 and the input 212 will be at essentially the same state and the impedance of the driver 210 will increase and the driver will not be sinking or sourcing current. Therefore, the driver will have little effect on current traveling through the laser diode driver 110. FIG. 2B is a second simplified circuit diagram of the laser diode driver damping circuit of FIG. 1B. In this implementation, the resistor 225 is coupled to the driver input 212 and the driver output 214, in stead of between the inputs. This implementation will be described in greater detail with reference to FIG. 5.

Figure 3:
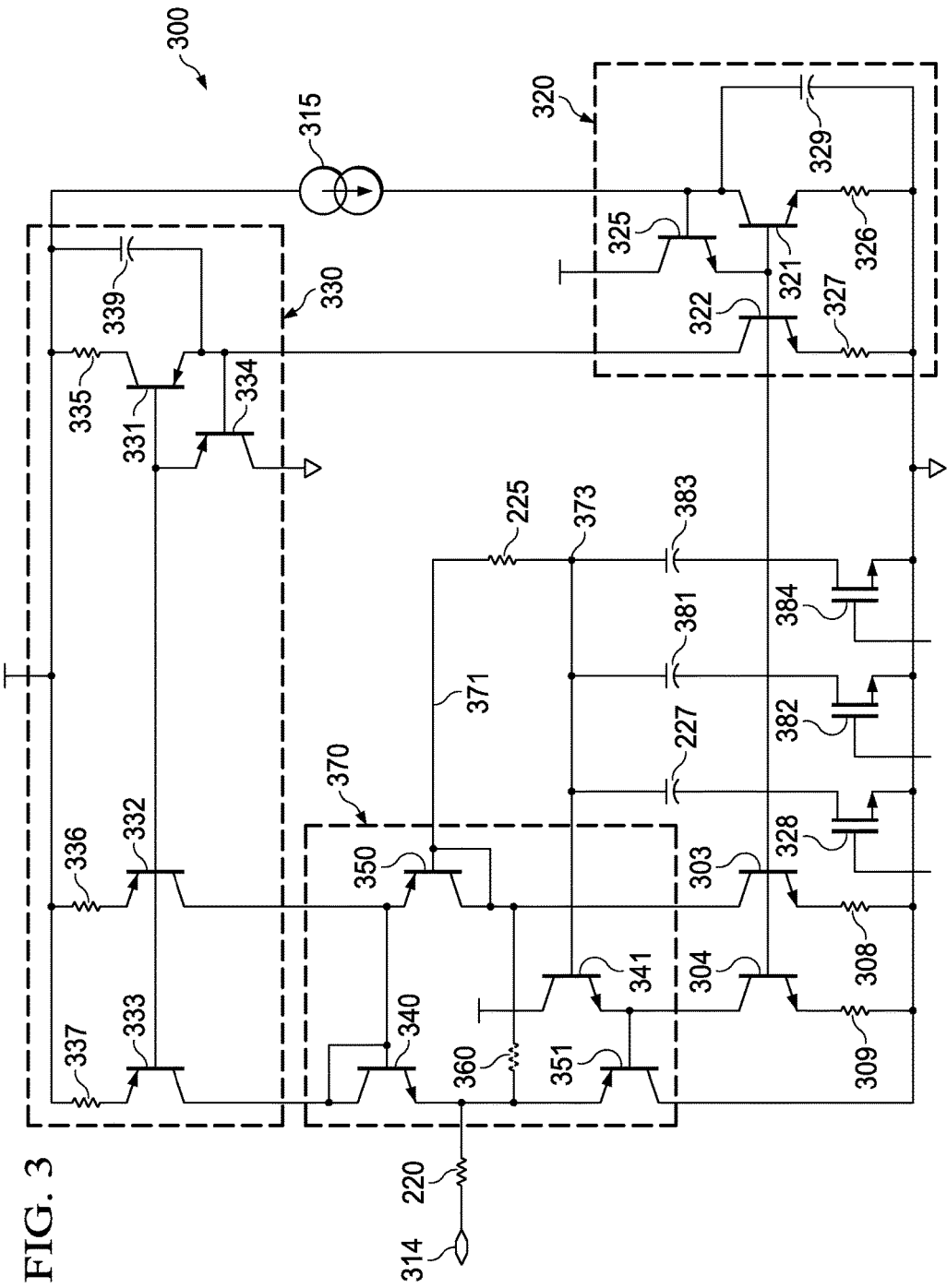
FIG. 3 is a circuit diagram of a first implementation of the simplified circuit of FIG. 2A.

FIG. 3 is a circuit diagram 300 of a first implementation of the simplified circuit of FIG. 2A. This implementation may include wave shape control, which may change the rise-time, fall-time, or overshoot of the output current waveform. An output 314 can connect this damping circuit to the LDWD 165 which is also connected to the LDRD 167. For this implementation, the anode of the laser diode is connected to the current driver 160 and the cathode is connected to ground. A current source 315 provides bias current for operating the damping circuit 168. A compensated beta-helper, current mirror 320 receives the bias current from the current source 315. Transistors 321, 322 and 325, resistors 326-327, and capacitor 329 form this current mirror, though alternative implementations may result by including other devices within this current mirror. If the resistor 327 is approximately equal to the resistor 326 and the areas of transistor 321 and the transistor 322 are approximately equal, then the collector current from the transistor 322 will be approximately equal to the current from the current source 315.

The transistor 321 and the resistor 326 serve as the master for the compensated beta-helper, current mirror 320. There are also additional slave devices such as transistors 303-304 and resistors 308-309. Depending on the scaling of these transistors and resistors, the current in transistors 303-304 may be a scaled version of the current through the current source 315. Given the current mirror 320, the current in the transistor 322 is also the master current for another current mirror 330, which is a PNP current mirror. The current mirror 330 may include the transistors 331-334, resistors 335-337, and capacitor 339. The device 334 is the beta-helper for the current mirror 330, while the device 339 is a compensation capacitor. The collector current in the transistors 332-333 vary depending on device sizes and will be a scaled version of the current from the transistor 322, which is also approximately equal to the current from the current source 315. When the devices within the current mirror 320 and the current mirror 330 are scaled essentially identically, the currents in transistors 332, 333, 321, and 322 are approximately the same; this current is also approximately equal to the bias current from current source 315.

Devices 340, 341, 350 and 351 form a driver 370, such as driver 210. By way of example, the area of the transistor 340 may be approximately equal to the area of the transistor 341. Similarly, the area of the transistor 350 may be approximately equal to the area of transistor 351. This driver 370 has an input terminal 371 that connects to the base of the device 350 and an input terminal 373 that connects to the base of the device 341. For driver 370, voltage comes from the output node 314, which may be at some voltage that is between a positive supply voltage $V_{CC}$ and a ground voltage. The voltage at the base of the device 340 (first control node) is approximately a diode above the voltage at the output node 314, since the device 340 is a diode-connected NPN transistor. In contrast, the voltage at the base of the device 350 (second control node) is approximately equal to the voltage at the output node 314 as input 371 is shifted down by diode-connected PNP transistor 350. These voltages will differ because of the difference in transistor types, such as NPN type transistor versus PNP type transistor.

Both the device 350 and the device 340 are diode connected transistors, which enables the driver to work mainly in one direction (such as when current is sourced into the laser diode) and it provides a path for the output voltage to the input of the driver. It also enables the circuit when at steady state to not sink or source any current which can cause an error in the laser diode current. Because the collector current for the transistor 303 approximately equals the collector current for the transistor 332, the current sourced from the transistor 332 will essentially flow through the transistor 350 and be sunk by the transistor 303. The current from the transistor 333 will then flow through the transistor 340. The current from the transistor 304 will flow through the transistor 341. The voltage at the emitter of the transistor 341 will be a diode drop down from the base of the transistor 350 because it is an NPN type transistor, as the voltage drop across the resistor 225 is negligible as it only has base currents flowing through it.

If the voltage around the driver 370 is calculated with the devices having all the same area and currents, the voltage across the base-emitter terminals of the transistor 351 is approximately equal to a diode because it is a PNP type transistor. As this transistor conducts, the current that goes through the transistor 340. The driver 370 will be biased with each device having a current equal to the current in the current source 315 and the voltage at the bases of the transistor 350 (input 373) and the transistor 341 will be roughly equal to the voltage at the terminal 314. The difference is the result of a PNP versus NPN diode drop.

The driver 370 may also be configured so that it does not draw any current while the output terminal 314 is static. In that situation, all the current from each current source and sink is approximately equal. The voltage drop across the base-emitter junctions of the transistor 350 and the transistor 351 are approximately equal and the voltage drop across the base-emitter junctions of the transistor 340 and the transistor 341 are approximately equal. As the output current increases, the voltage at the base of transistor 340 increases along with the voltage at the base of the transistor 351, which essentially tracks the voltage of the output terminal 314. The voltage at the base of the transistor 341 will have not changed, because there is a RC filter composed of the resistor 225 and the capacitors 227, 381, and 383.

The base of the transistor 341 will be held at a prior value on the terminal 314 and so will its emitter. This emitter is connected to the base of the transistor 351. As the emitter of the transistor 351 is pulled higher by the terminal 314, then it will start to conduct more current than just the current from the transistor 333. This extra current will be subtracted from the driver currents coming from the LDRD and the LDWD and effectively dampen the overshoot and reduce ringing. In other words, this damping circuit is providing a resistive element, or low impedance, into the LC circuit (composed of the laser diode inductance and driver capacitance), that will lower its Q, or quality factor and reduce the ringing of the LC circuit. The resistor 220 can also match the impedance of a transmission line for improving signal fidelity. In some implementations, the resistor 220 may be removed to provide a lower impedance if needed. The higher current in the transistor 351 stays on until the voltage at the base of the transistor 341 has been charged up to a voltage that is effectively the output voltage on the terminal 314 given the difference of a PNP diode drop and an NPN diode drop.

The circuit diagram 300 includes parallel capacitors 227, 381, and 383. Though three capacitors are shown, another implementation may result by using a different number of capacitors, such as two, four, five or some other suitable number. Capacitors 227, 381, and 383 can be selected independently or in parallel by enabling MOS devices 328, 382, or 384. This makes the time constant within the driver 370 programmable so the amount of damping can be customized. For example, a fast time constant may only use the smallest value of capacitance. This means that the voltage at the base of transistor 341 tracks the output voltage very quickly, which would provide less damping.

As mentioned earlier, the driver works effectively in one direction when there is current being sourced into the laser diode and the voltage at 314 is increasing. Typical driver configurations will work in either direction. The diode connected configuration of transistor 340 allows the driver 210 to work in only one direction. It may be desirable to only provide damping when current is being sourced into the laser diode (when it's light intensity is increasing which is the rising edge of the current into the laser diode) and not when the laser diode is turning off. The damping configuration of FIG. 3 will not affect the falling edge of the current in the laser diode.

When the current from the drivers is decreased, 314 decreases in voltage. In this situation, transistor 340 base is held by emitter 350, but that can be easily reversed bias as the current from transistors 333 and 332 go into transistor 340 making it a floating diode or high impedance and shutting off device 350. There will be some slight damping effect as the current from the transistor 340 will flow into the laser diode to counter the effect of reducing the current, but it will just be the bias current from transistors 333 and 332 without any current gain. Transistor 351 can also be shut off (reverse biased) as the current is decreased in the laser diode and the damping circuit will essentially look like a high impedance and will not affect the fall-time associated with the lowering of current in the laser diode.

The circuit diagram 300 also includes a resistor 360. This device is shown as dotted because one implementation of this circuit may include the resistor 360, while another implementation does not. This resistor may be very large, such as a resistor with a resistance between approximately 5000 Ohms and approximately 100000 Ohms. Given its size, the current through resistor 360 will be small, but it will ensure that the base of the transistor 350 and the output voltage become approximately equal and the damping circuit operates properly. In contrast, the resistor 225 is typically small, such as a resistor with a resistance between approximately 50 Ohms and approximately 500 Ohms. Thus, there generally is not a large voltage drop across it; rather base current from the transistor 341 base and a few transient currents are generally the main currents through it.

Figure 4:
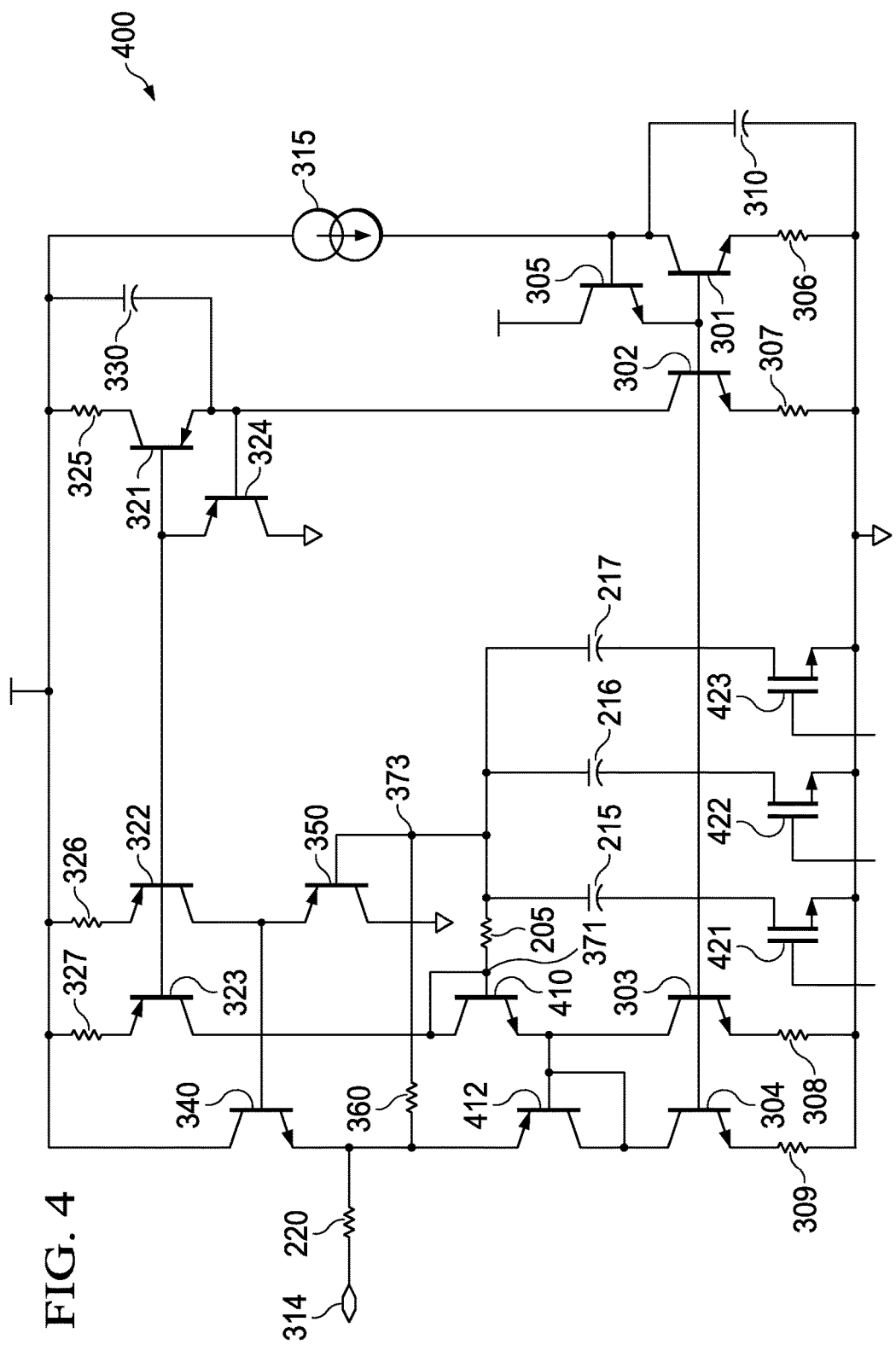
FIG. 4 is a circuit diagram of a second implementation of the simplified circuit of FIG. 2A.

FIG. 4 is a circuit diagram 400 of a second implementation of the simplified circuit of FIG. 2A. In this implementation, a laser diode cathode is connected to the terminal 314, while the anode is connected to a positive voltage supply. Though similar to FIG. 3, the transistors 410, 412 are diode connected and the function of the PNP's and NPN's has been swapped. Another implementation may result from changing the MOS switches 421, 422, and 423 from NMOS to PMOS, while connecting them to the positive supply voltage.

Figure 5:
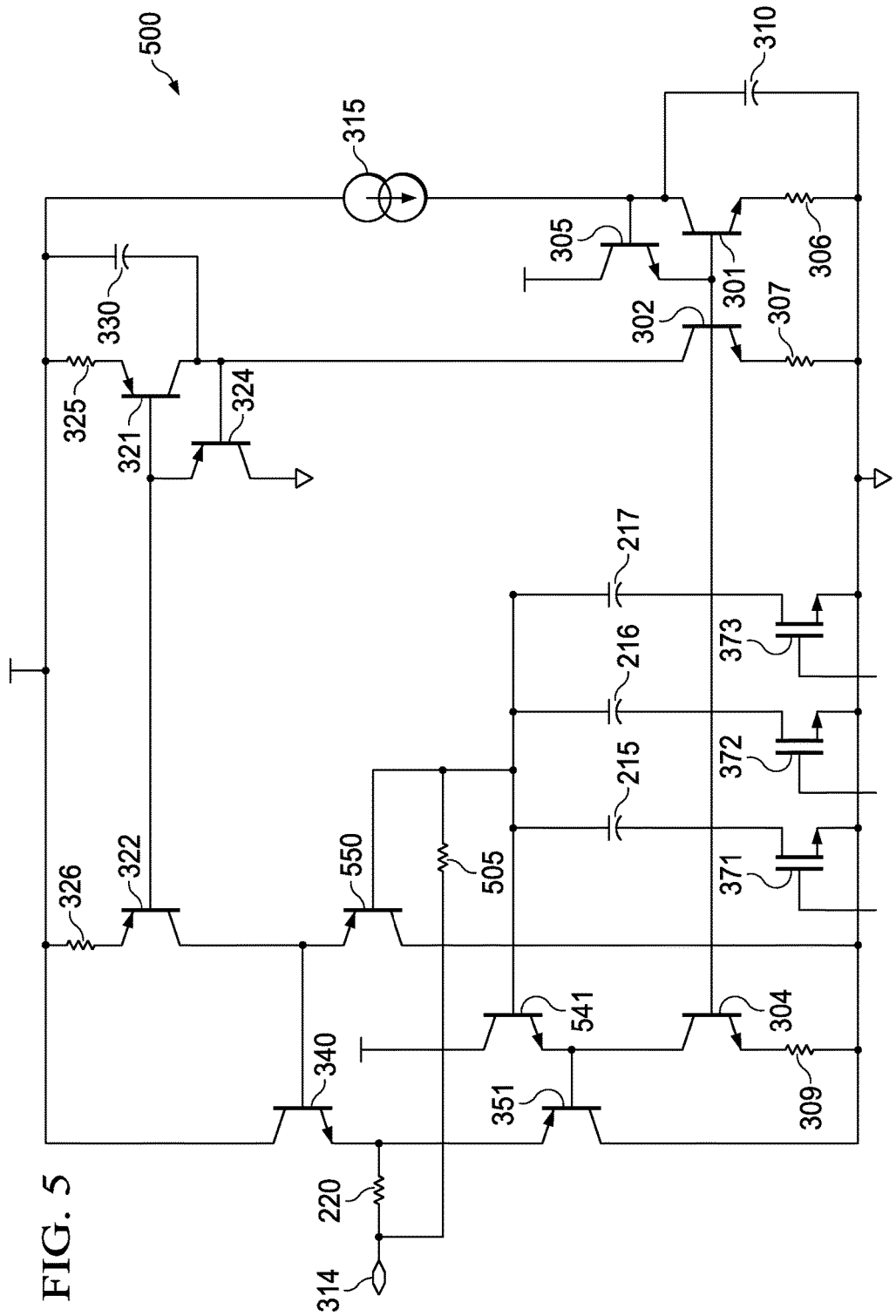
FIG. 5 is a circuit diagram of a first implementation of the simplified circuit of FIG. 2B.

FIG. 5 is a circuit diagram 500 of a first implementation of the simplified circuit of FIG. 2B. In this implementation, the resistor 505 is in series from the terminal 314 to both base inputs for devices 541, 550. And, the current sources 303, 323 described with reference to FIG. 3 are no longer included in this implementation. This circuit would be active when the current is increasing and decreasing in the laser diode and would still have the property of being delayed by the time constant. The circuit 500 does have one issue and that the difference in the base-emitter voltages from the input will cause this circuit to draw some current from the laser diode, so it contributes to error in the laser diode current and also uses more power in a static state.

While various embodiments of the laser diode driver damping circuit have been described, it may be apparent to those of ordinary skill in the art that many more embodiments and implementations are possible that are within the scope of this system. Although certain aspects of the laser diode driver damping circuit may be described in relation to specific techniques or structures, the teachings and principles of the present system are not limited solely to such examples. All such modifications are intended to be included within the scope of this disclosure and the present laser diode driver damping circuit and protected by the following claim(s).

The invention claimed is:

1. A damping circuit, comprising:
an output terminal;
a first transistor having a first control node connected to form a first diode, and a first current node coupled with the output terminal;
a second transistor having a second control node connected to form a second diode, and a second current node coupled to the first control node of the first transistor;
a buffer circuit coupled with the output terminal and the first transistor; and
a resistive-capacitive (RC) circuit coupled between the buffer circuit and the second control node of the second transistor.

2. The damping circuit of claim 1, wherein the buffer circuit includes:
a third transistor configured to generate a feedback voltage controlled by the second control node of the second transistor and having a delay established by the RC circuit; and
a fourth transistor coupled to the third transistor, the fourth transistor configured to damp the output terminal based on the feedback voltage.

3. The damping circuit of claim 1, wherein the first transistor includes a first NPN transistor having:
a first collector node configured to receive a first bias current;
a first base node as the first control node, the first base node connected to the first collector node to form the first diode; and
a first emitter node as the first current node coupled with the output terminal.

4. The damping circuit of claim 3, wherein the second transistor includes a first PNP transistor having:
a second emitter node as the second current node coupled to the first base node of the first NPN transistor;
a second collector node configured to receive a second bias current; and
a second base node as the second control node, the second base node connected to the second collector node to form the second diode.

5. The damping circuit of claim 4, wherein the buffer circuit having:
a second NPN transistor configured to generate a feedback emitter voltage controlled by the second base node of the first PNP transistor and having a delay established by the RC circuit; and
a second PNP transistor coupled to the second NPN transistor, the second PNP transistor configured to damp the output terminal based on the feedback emitter voltage.

6. The damping circuit of claim 1, wherein the first transistor includes a first PNP transistor having:
a first collector node configured to receive a first bias current;
a first base node as the first control node, the first base node connected to the first collector node to form the first diode; and
a first emitter node as the first current node coupled with the output terminal.

7. The damping circuit of claim 6, wherein the second transistor includes a first NPN transistor having:
a second emitter node as the second current node coupled to the first base node of the first PNP transistor;
a second collector node configured to receive a second bias current; and
a second base node as the second control node, the second base node connected to the second collector node to form the second diode.

8. The damping circuit of claim 7, wherein the buffer circuit having:
a second PNP transistor configured to generate a feedback emitter voltage controlled by the second base node of the first NPN transistor and having a delay established by the RC circuit; and
a second NPN transistor coupled to the second PNP transistor, the second PNP transistor configured to damp the output terminal based on the feedback emitter voltage.

9. The damping circuit of claim 1, wherein the RC circuit includes:
a resistor connected between the second control node and an input of the buffer circuit; and
a capacitor connected between the input to the buffer circuit and a ground terminal.

10. The damping circuit of claim 1, wherein the output terminal is adapted to receive a switching current for a laser diode.

11. A damping circuit, comprising:
an output terminal configured to receive a switching signal;
a two-stage clamping circuit coupled with the output terminal, the two stage clamping circuit configured to generate a clamp voltage based on the switching signal;
a delay circuit coupled to the two-stage clamping circuit to receive the clamp voltage;
a first buffer coupled to the delay circuit, the first buffer configured to generate a feedback voltage controlled by the delayed clamp voltage; and
a second buffer coupled to the first buffer, the second buffer configured to damp the switching signal at the output terminal based on the feedback voltage.

12. The damping circuit of claim 11, wherein the two-stage clamping circuit includes a first stage NPN transistor having:
   a first collector node configured to receive a first bias current;
   a first emitter node coupled with the output terminal;
   a first base node connected to the first collector node to generate an intermediate clamp voltage above the switching signal received by the output terminal.

13. The damping circuit of claim 12, wherein the two-stage clamping circuit includes a second stage PNP transistor having:
   a second emitter node coupled to the first base node of the first NPN transistor;
   a second collector node configured to receive a second bias current; and
   a second base node connected to the second collector node to generate the clamp voltage below the intermediate clamp voltage.

14. The damping circuit of claim 13, wherein:
   the first buffer includes a buffer NPN transistor having:
      a third base node coupled to the delay circuit; and
      a third emitter node configured to deliver the feedback voltage; and
   the second buffer includes a buffer PNP transistor having:
      a fourth base node coupled to the third emitter node of the buffer NPN transistor; and
      a fourth emitter node coupled with the output terminal.

15. The damping circuit of claim 11, wherein the two-stage clamping circuit includes a first stage PNP transistor having:
   a first collector node configured to receive a first bias current;
   a first emitter node coupled with the output terminal;
   a first base node connected to the first collector node to generate an intermediate clamp voltage above the switching signal received by the output terminal.

16. The damping circuit of claim 15, wherein the two-stage clamping circuit includes a second stage NPN transistor having:
   a second emitter node coupled to the first base node of the first PNP transistor;
   a second collector node configured to receive a second bias current; and
   a second base node connected to the second collector node to generate the clamp voltage below the intermediate clamp voltage.

17. The damping circuit of claim 16, wherein:
   the first buffer includes a buffer PNP transistor having:
      a third base node coupled to the delay circuit; and
      a third emitter node configured to deliver the feedback voltage; and
   the second buffer includes a buffer NPN transistor having:
      a fourth base node coupled to the third emitter node of the buffer PNP transistor; and
      a fourth emitter node coupled with the output terminal.

18. A laser driver circuit, comprising:
   a laser diode driver configured to generate a switching signal for a laser diode;
   an output terminal arranged to deliver the switching signal from the laser diode driver to the laser diode;
   a two-stage clamping circuit coupled with the output terminal, the two stage clamping circuit configured to generate a clamp voltage based on the switching signal;
   a delay circuit coupled to the two-stage clamping circuit, and delay circuit configured to delay the clamp voltage; and
   a two-stage buffer circuit coupled to the delay circuit, the two-stage buffer circuit configured to damp the switching signal at the output terminal based on the delayed clamp voltage.

19. The laser driver circuit of claim 18, wherein the two-stage clamping circuit includes a first stage NPN transistor having:
   a first collector node configured to receive a first bias current;
   a first emitter node coupled with the output terminal;
   a first base node connected to the first collector node to generate an intermediate clamp voltage above the switching signal received by the output terminal.

20. The laser driver circuit of claim 19, wherein the two-stage clamping circuit includes a second stage PNP transistor having:
   a second emitter node coupled to the first base node of the first NPN transistor;
   a second collector node configured to receive a second bias current; and
   a second base node connected to the second collector node to generate the clamp voltage below the intermediate clamp voltage.

21. The laser driver circuit of claim 20, wherein the two-stage buffer circuit includes:
   a buffer NPN transistor having:
      a third base node coupled to the delay circuit; and
      a third emitter node configured to deliver the feedback voltage; and
   a buffer PNP transistor having:
      a fourth base node coupled to the third emitter node of the buffer NPN transistor; and
      a fourth emitter node coupled with the output terminal.

22. The laser driver circuit of claim 18, wherein the two-stage clamping circuit includes a first stage PNP transistor having:
   a first collector node configured to receive a first bias current;
   a first emitter node coupled with the output terminal;
   a first base node connected to the first collector node to generate an intermediate clamp voltage above the switching signal received by the output terminal.

23. The laser driver circuit of claim 22, wherein the two-stage clamping circuit includes a second stage NPN transistor having:
   a second emitter node coupled to the first base node of the first PNP transistor;
   a second collector node configured to receive a second bias current; and
   a second base node connected to the second collector node to generate the clamp voltage below the intermediate clamp voltage.

24. The laser driver circuit of claim 23, wherein the two-stage buffer circuit includes:
   a buffer PNP transistor having:
      a third base node coupled to the delay circuit; and
      a third emitter node configured to deliver the feedback voltage; and
   a buffer NPN transistor having:
      a fourth base node coupled to the third emitter node of the buffer PNP transistor; and
      a fourth emitter node coupled with the output terminal.

* * * * *